United States Patent [19]
Kariya et al.

[11] Patent Number: 4,963,921
[45] Date of Patent: Oct. 16, 1990

[54] DEVICE FOR HOLDING A MASK
[75] Inventors: Takao Kariya, Hino; Hidehiko Fujioka, Atsugi, both of Japan
[73] Assignee: Canon Kabushiki Kaisha, Tokyo, Japan
[21] Appl. No.: 312,761
[22] Filed: Feb. 21, 1989

Related U.S. Application Data

[63] Continuation-in-part of Ser. No. 151,978, Feb. 3, 1988, and a continuation-in-part of Ser. No. 140,900, Dec. 23, 1987, and a continuation-in-part of Ser. No. 875,986, Jun. 19, 1986, abandoned.

[30] Foreign Application Priority Data

Jun. 24, 1985 [JP] Japan ................................ 60-135942
Jun. 24, 1985 [JP] Japan ................................ 60-135943
Jun. 24, 1985 [JP] Japan ................................ 60-135944
Jun. 24, 1985 [JP] Japan ................................ 60-094416
Feb. 9, 1987 [JP] Japan ................................ 62-026456

[51] Int. Cl.$^5$ ............................................. G03B 27/42
[52] U.S. Cl. ......................................... 355/53; 355/74; 269/8
[58] Field of Search ...................... 355/74, 53, 86; 335/285, 289, 295; 269/8, 21, 903

[56] References Cited

U.S. PATENT DOCUMENTS 3,428,867 2/1969 Becker .................. 335/284
3,740,683 6/1973 Benson ................. 335/284
3,978,441 8/1976 Sobottka et al. ...... 335/284
3,993,509 11/1976 McGinty ............ 335/289 X
4,418,420 11/1983 Bauer, et al. ........... 378/187
4,720,732 1/1988 Tsutsui ................ 355/53 X
4,737,824 4/1988 Sakai, et al. ............ 355/53

FOREIGN PATENT DOCUMENTS 0152294 2/1985 European Pat. Off. .
3435178 4/1985 Fed. Rep. of Germany .
3620970 1/1987 Fed. Rep. of Germany .
57-87129 5/1982 Japan ................................ 355/53
57-177536 11/1982 Japan ................................ 355/53
58-56744 4/1983 Japan ................................ 269/8
58-94948 6/1983 Japan ................................ 269/8
60-77424 5/1985 Japan .
61-294441 12/1986 Japan .
61-204442 12/1986 Japan .
61-294443 12/1986 Japan .

Primary Examiner—Monroe H. Hayes
Assistant Examiner—D. Rutledge
Attorney, Agent, or Firm—Fitzpatrick, Cella, Harper & Scinto

[57] ABSTRACT

A device for detachably holding a mask at least a portion of which is made of a magnetic material. The device includes a holding member, on which the mask is to be held, the holding member having a portion made of a magnetic material; a first system for producing holding magnetic lines of force so as to generate a magnetic force between the magnetic portion of the holding member and the magnetic portion of the mask, to thereby hold the mask on the holding member; and a second system for producing releasing magnetic lines of force which are operative against the magnetic lines of force produced by the first system so as to reduce the same to a degree sufficient to disengage the mask from the holding member. Also, disclosed is a mask holding device for detachably holding a mask, typically for use in the manufacture of microcircuits, which device is arranged to hold the mask by use of a magnetically attracting force, the magnetically attracting force being made variably controllable so as to correct the flatness of the mask.

15 Claims, 15 Drawing Sheets

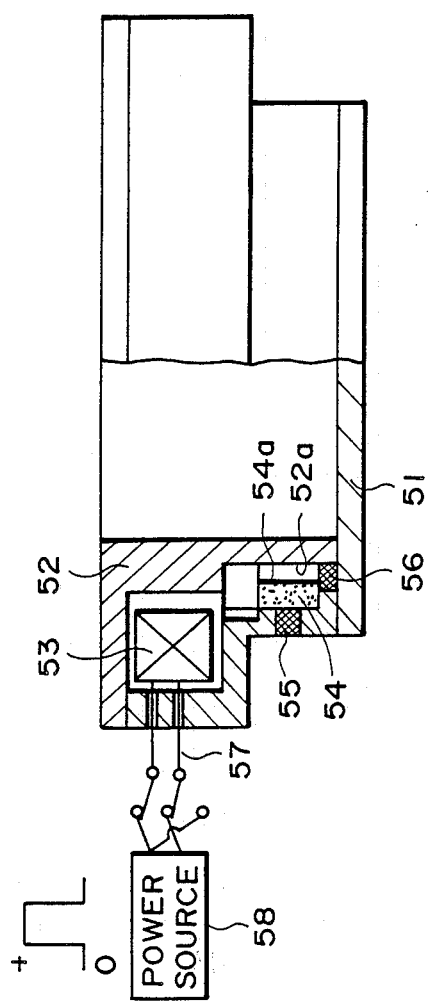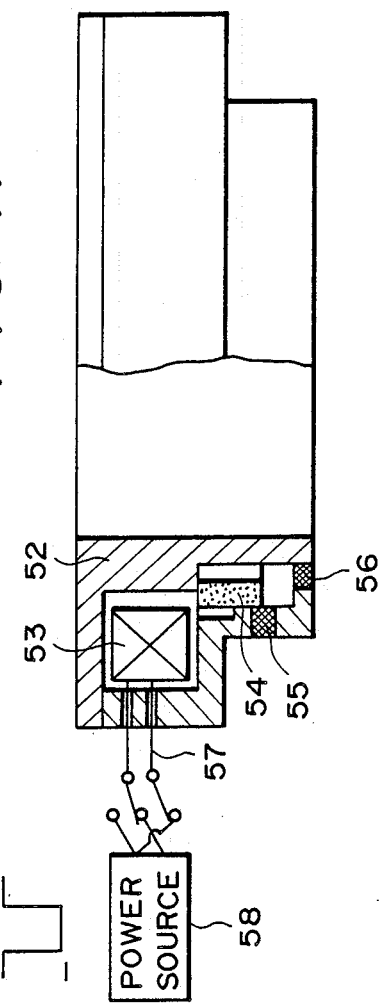

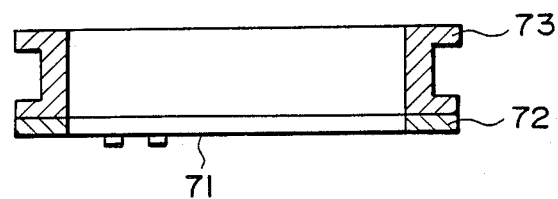
F I G. 14
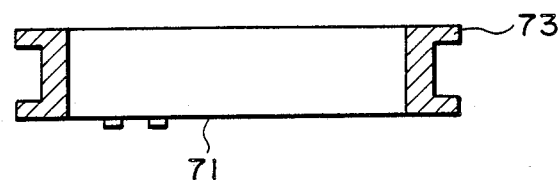
F I G. 15
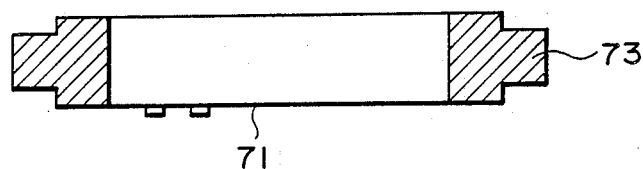
F I G. 16
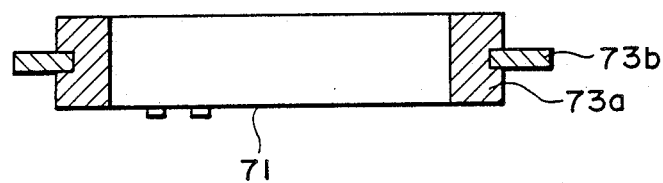
F I G. 17

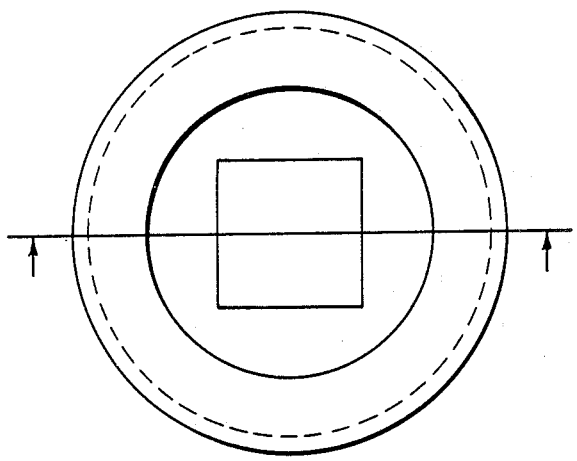
FIG. 18
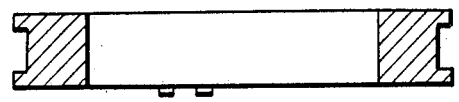
FIG. 19
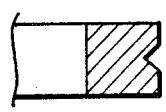 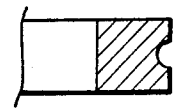
FIG. 20    FIG. 21

DEVICE FOR HOLDING A MASK

This application is a continuation-in-part of application Ser. Nos. 151,978, filed Feb. 3, 1988; 140,900, filed Dec. 23, 1987; and 875,986, filed June 19, 1986, now abandoned.

FIELD OF THE INVENTION AND RELATED ART

This invention relates to a device for holding a mask (photomask or reticle) usable in the manufacture of semiconductor devices such, as integrated circuits or the like. More particularly, the present invention is concerned with a mask holding device which allows easy holding and detachment of a mask in an environment containing a particular gas or maintained in a vacuum and which, in addition thereto, assures holding the mask accurately.

The tendency toward higher density of circuit patterns to be formed on semiconductor circuit devices requires the width of lines forming the circuit pattern to be smaller and smaller, and the line width, even to the extent on the order of sub-microns, is required at present. As for irradiation energy to be used for the sake of transfer of circuit patterns, it becomes necessary, in order to meet the above, to use ultraviolet (UV) rays, deep-UV rays, soft X-rays, beams of charged-particles, such as ion beams or electron beams, etc. Use of such radiation energy leads to the necessity that the ambience surrounding the path of radiation energy is filled with a particular gas, such as N, He, etc., or maintained in a vacuum at a pressure of $1 \times 10^{-6}$ Torr, for example.

FIGS. 1 and 2 show examples of known type mask holding devices. Of these Figures, FIG. 1 shows a mask holding device of vacuum-suction type. This holding device is usable in an ambient gas and is adapted to hold a mask by vacuum suction. Denoted in FIG. 1 by numeral 1 is a mask; by 10, an evacuating pipe connected to an unshown evacuating device; by 11, an evacuating groove formed in a mask holding plate 12. In operation, the mask 1 is first brought into contact with the mask holding plate 12 and the gas in the evacuating groove 11 is evacuated by way of the evacuating pipe 10. This causes a difference between the pressure of the ambient gas and the pressure within the evacuating groove. Thus, the mask is held by the mask holding plate 12 by vacuum-suction. In this case, however, a substantial amount of ambient gas is drawn from between the opposed surfaces of the plate 12 and the mask 1 and it is exhausted by way of the pipe 10. As a result, the pressure of the ambient gas is undesirably reduced and the consumption of the ambient gas is unpreferably increased. Furthermore, the holding device of this example is difficult to use in a low-pressure ambient gas or in vacuum, because the holding force utilizing the vacuum-suction is reduced.

FIG. 2 shows a mask holding device for holding a mask with an electromagnetic force. This type of mask holding device is disclosed in Japanese Laid-Open Patent Application, Laid-Open No. 60/77424. In FIG. 2, denoted by numeral 2 is a yoke for forming a magnetic path; by 3, a solenoid coil for producing magnetic lines of force; and by 8, lead wires for energizing the solenoid coil 3. Denoted by numeral 13 are cooling pipes for removing heat generated at the solenoid coil 3. When, in the state of FIG. 2, the solenoid coil 3 is energized while the mask 1 is maintained in contact with the yoke 2, the mask 1 is attracted to the yoke 2 magnetically. When, on the other hand, the energization of the solenoid coil 3 is stopped, the mask 1 is disengaged from the yoke 2. In this type of holding device, however, energization of the solenoid coil causes heat generation due to the Joule heat. This leads to a possibility of occurrence of thermal strain in the mask. In order to avoid this, it is necessary to flow a cooling medium into the cooling pipe 13 from an unshown cooling system to thereby remove the thus produced heat.

As described, the magnetic chuck utilizing the electromagnetic force involves problems of generation of a substantial amount of heat at the energizing coil, a necessity of provision of suitable means for cooling the coil, and a resultant necessity of the provision of complicated piping, which disadvantageously leads to bulkiness of the device. Also, handling is cumbersome, and an increased manufacturing cost is required.

The above-described disadvantages are also found in the cases of mask holding devices incorporated into mask feeding devices.

FIG. 3 shows an example of such a mask holding device which is incorporated into a mask feeding device. The holding device shown in FIG. 3 is of the type in which the mask is held by vacuum-suction. Similarly, the device of FIG. 3 is usable in an ambient gas to hold the mask 1 by vacuum suction. In FIG. 3, denoted by numeral 1 is a mask membrane having a circuit pattern; by 32, a mask base for supporting the mask membrane 1; by 34, a mask holding plate; by 35, an evacuating pipe connected to an unshown evacuating device; and by 36, an evacuating groove formed in the mask holding plate.

In the case of the mask holding device of FIG. 3, substantially the same problems as has been described with reference to FIG. 1 are encountered. Particularly, the mask holding device cannot be incorporated into the mask feeding device which is to be used in a low-pressure ambient gas or in vacuum, because the holding force utilizing the vacuum-suction is decreased.

FIG. 4 shows another example of a mask holding device incorporated into a mask feeding device. The mask holding device shown in FIG. 4 is of the type in which the mask is held by use of an electromagnetic force. In FIG. 4, denoted by numeral 37 is a yoke for forming a magnetic path; by 38, a solenoid coil for producing magnetic lines of force; by 39, lead wires for energizing the solenoid coil 38. When the solenoid coil 38 is energized while contacting the mask base 32 to the yoke 37, the mask base 32 is attracted to the yoke 37 magnetically. When, on the other hand, the energization of the solenoid coil 38 is stopped, the mask base 32 is disengaged from the yoke 37. In this type of mask holding device, substantially the same disadvantages as has been described with reference to FIG. 2 are encountered.

On the other hand, the flatness of a membrane of a mask is determined by the total precision which is determined by the flatness of a holding surface of the mask holding device to which the mask is attracted, the flatness of a mask frame (lip surface and/or a surface to be attracted) to which the membrane is attached, the flexure of the mask as a whole due to the gravity, etc. Once the mask is attracted to and held by the mask holding device, a certain flatness is determined.

Conventional mask holding devices include no specific means for controlling or correcting the flatness of the mask membrane. If the membrane of the mask held by the mask holding device is not disposed exactly in a plane which is predetermined, there occurs uneven pattern transfer (e.g. blurring of the transferred pattern) as a result of the exposure of a semiconductor wafer to the pattern of the mask. This is undesirable.

SUMMARY OF THE INVENTION

It is accordingly a primary object of the present invention to provide a mask holding device which is stably operative in any environment such as, for example, gas, liquid, low pressure, vacuum, etc. and which can be manufactured easily and with a minimum cost.

It is another object of the present invention to provide a mask holding device suitably usable in a semiconductor device manufacturing apparatus in which accurate and precise holding of a mask is required.

It is a third object of the present invention to provide a mask structure which allows easy and stable feeding of the mask itself in any environment such as gas, liquid, low pressure, vacuum, etc., and which allows use of a desired one of various types of mask holding devices, such as a vacuum-suction type, magnetic attraction type, mechanical holding type, and the like.

Briefly, according to one aspect of the present invention, there is provided a device for detachably holding a mask, at least a portion of which is made of a magnetic material. The device including: a holding member on which the mask is to be held, said holding member having a portion made of a magnetic material; first means for producing holding magnetic lines of force effective to generate a magnetic force between said magnetic portion of said holding member and the magnetic portion of the mask, to thereby hold the mask on said holding member; and second means for producing releasing magnetic lines of force which are operative against the magnetic lines of force produced by said first means so as to reduce the same to a degree sufficient to disengage the mask from said holding member.

It is a further object of the present invention to provide a mask holding device and method by which the flatness of a membrane of a mask can be corrected so as to assure desired flatness.

In accordance with another aspect of the present invention, there is provided a mask holding device having a mask holder and a plurality of electromagnets operable to attract and hold a frame of a mask, wherein controlled electric currents are supplied to solenoid coils of the electromagnets so as to assure desired flatness.

In a further aspect, the mask holding device of the present invention includes a mask holder to which a mask frame is detachably attracted, a plurality of solenoid coils embedded in a circumferential portion of the mask holder, permanent magnet means effective to attract the mask frame to the mask holder, and control means operable to supply controlled and different electric currents to the solenoid coils, respectively. Permanent magnets may be disposed and used as cores of the solenoid coils of the mask holder, respectively. Also, at least a portion of the mask frame may be made of a magnetic material so that the mask frame can be attracted by the permanent magnets. Alternatively, each solenoid coil of the mask holder may be provided with a core or yoke made of a magnetic material and a permanent magnet may be provided on, or in, the mask frame at a position opposed to the magnetic core or yoke. In any case, the permanent magnets used function to attract the mask frame to the mask holder, and controlled electric currents are supplied to the solenoid coils so as to improve the flatness of the membrane of the mask attracted to and held by the mask holder. Namely, by adjusting the attracting force, the flatness of the mask membrane is controlled.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 11 is a sectional view schematically and diagrammatically showing a mask holding device according to a further embodiment of the present invention.

FIG. 12 is a view similar to FIG. 11 and showing the mask holding device when it is in a state in which a mask is disengaged therefrom.

FIG. 14 is a sectional view schematically showing a mask structure according to one aspect of the present invention.

FIG. 15 is a sectional view showing a mask structure according to another embodiment of the present invention, in which a mask is directly adhered to a mask frame.

FIG. 16 is a sectional view showing a mask structure according to another embodiment of the present invention, in which a protrusion is formed on a frame.

FIG. 17 is a sectional view showing a mask structure according to a still further embodiment of the present invention, in which a protrusion or flange is mounted on a groove formed in a frame.

FIG. 18 is a plan view showing a mask structure according to another embodiment of the present invention.

FIG. 19 is a sectional view showing the mask structure of the FIG. 18 embodiment.

FIGS. 20 and 21 are fragmentary sectional views, respectively, showing modified forms of the mask structure of the embodiment shown in FIGS. 18 and 19.

DESCRIPTION OF THE PREFERRED EMBODIMENTS

Figure 1:
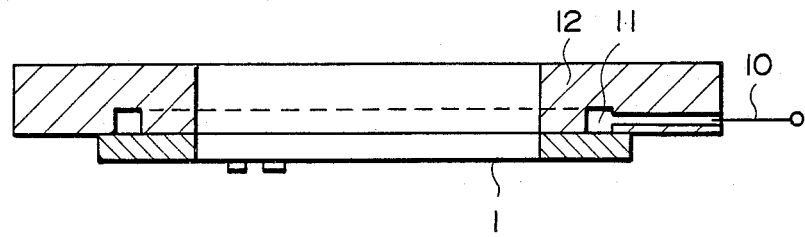
FIG. 1 is a sectional view showing an example of a known type mask holding device utilizing a vacuum-suction force.
Figure 2:
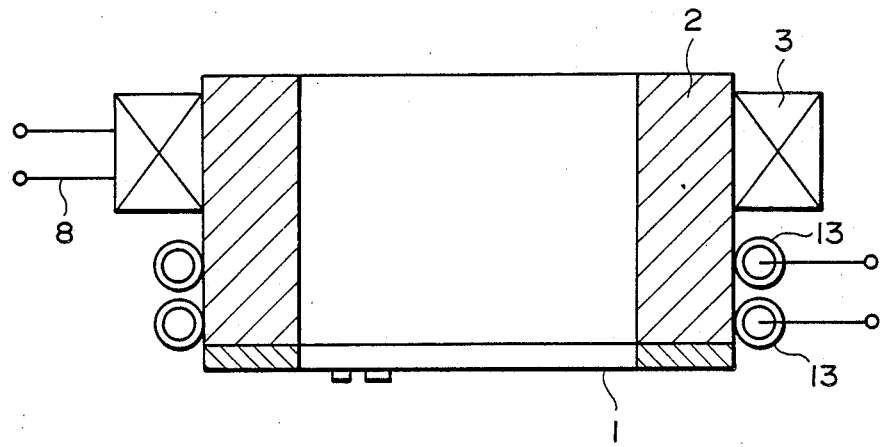
FIG. 2 is a sectional view showing an example of a known type mask holding device utilizing an electromagnetic force.
Figure 3:
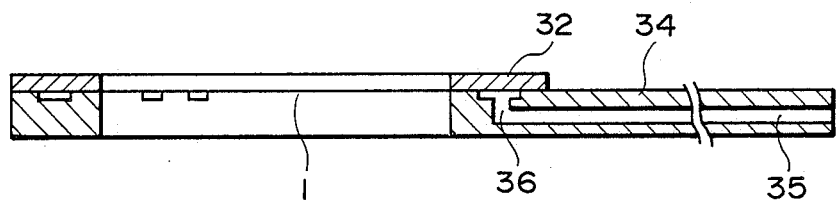
FIG. 3 is a sectional view showing an example of a known type mask holding device incorporated into a mask feeding device.
Figure 4:
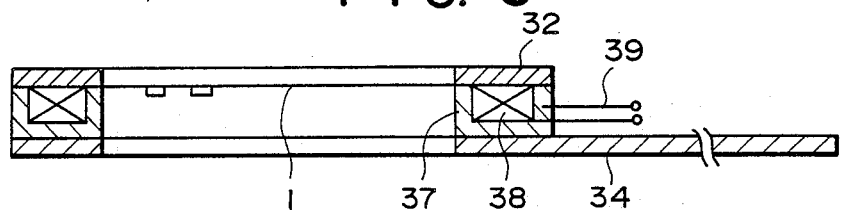
FIG. 4 is a sectional view showing another example of a known type mask holding device incorporated into a mask feeding device.
Figure 5:
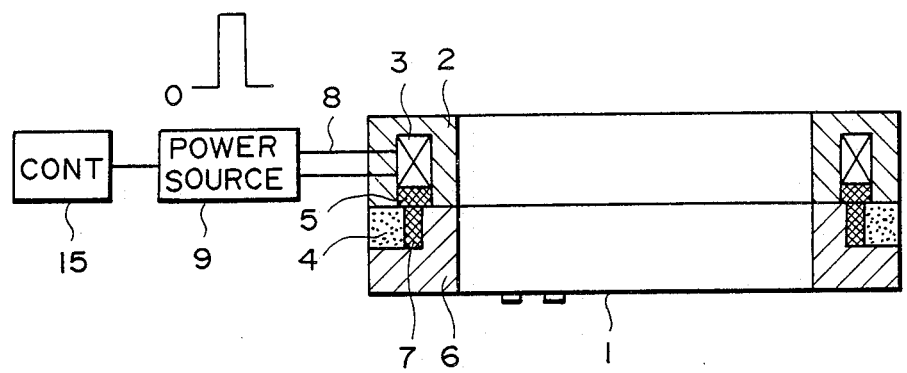
FIG. 5 is a sectional view schematically and diagrammatically showing a mask holding device according to one embodiment of the present invention.

Referring now to FIG. 5, there is shown a mask holding device according to one embodiment of the present invention.

In this example, a mask membrane 1 has a circuit pattern formed on its lower surface and also has its outer peripheral portion connected, by adhesion or the like, to a mask frame 6 of ring-like shape. A yoke 2 has a ring-like shape and is contributable to form a magnetic path for attracting the mask frame 6 to the yoke 2, or alternatively, to disengage the mask frame 6 from the yoke 2, as will be described later. A solenoid coil 3 is mounted in the yoke 2 which is adapted to produce magnetic lines of force effective to disengage the mask frame 6 from the yoke 2, also as will be described later. In this embodiment, each of the yoke 2 and the mask frame 6 is made of a suitable magnetic material. As shown in FIG. 5, a permanent magnet 4 of ring-like shape is fixedly secured to the mask frame 6. The permanent magnet 4 is disposed so that its magnetic poles are aligned substantially longitudinally as viewed in FIG. 5. A separator 5 of ring-like shape is mounted in the yoke 2. The separator 5 is formed of a non-magnetic material and is disposed so as to direct the magnetic lines of force to define a desired magnetic path. Another separator 7 formed of a non-magnetic material is mounted on the mask frame 6. The separator is effective to direct the magnetic lines of force (magnetic flux) produced from the permanent magnet 4, so that they extend through the material of the mask frame 6. Lead wires 8 are connected to the solenoid coil 3 for the sake of energization thereof. The permanent magnet 4 and the separator 7 are made immovable relative to the mask frame 6. Also, the solenoid coil 3 extends in a direction substantially along the mask frame 6.

When, in operation, the mask frame 6 is put close to the yoke 2, the magnetic flux of the magnet 4 reaches the yoke 2 directly and by way of the magnetic path defined in the mask frame 6, with the result that the mask frame 6 is attracted to the yoke 2. Thus, a closed magnetic path (magnetic circuit) extending through the permanent magnet 4, mask frame 6 and yoke 2 is formed. Thus, the mask frame 6 is continuously attracted under the influence of the magnetic field of the permanent magnet 4.

When the mask frame 6 is to be disengaged from the yoke 2, an instruction signal is supplied from a control means 15 to a power source 9 which is adapted to produce an electric current of pulse-like form, such as schematically depicted in FIG. 5. In response to the instruction signal from the control means 15, the power source 9 produces an electric current of pulse-like form which is applied to the solenoid coil 3 by way of the lead wire 8. By this, the solenoid coil 3 produces magnetic lines of force. The electric current to be supplied to the solenoid coil 3 is preset so that the magnetic flux produced by the solenoid coil 3 is repulsive to the magnetic flux produced by the permanent magnet 4. As a result, the magnetic force of the permanent magnet is temporarily canceled, such that the mask frame 6 is disengaged from the yoke 2.

In the embodiment of FIG. 5, the permanent magnet is fixedly secured to the mask frame, while the yoke, solenoid coil and so on are fixedly mounted on an unshown base member of the holding device. However, this arrangement may be reversed. That is, the permanent magnet may be fixedly secured to the base member of the holding device, and the yoke and the solenoid coil may be mounted on the mask frame. Substantially the same effects are attainable in this case.

Figure 6:
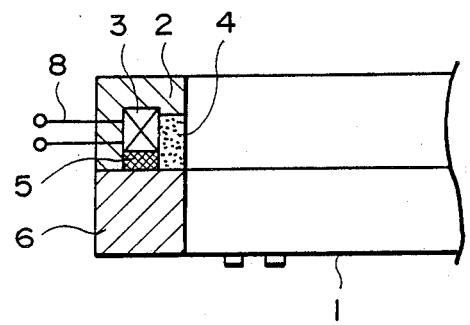
FIG. 6 is a fragmentary sectional view showing a modification of the FIG. 5 embodiment, in which modification, a permanent magnet and a solenoid coil are provided in a mask holding base member of the device.

Also, when a plate-like mask is used, the mask frame member described in the foregoing may be omitted. And, in such case, a portion of the mask and/or the mask pattern is formed of a magnetic material, in order to assure that the mask is magnetically attracted to the yoke of the holding device. It is a further possible alternative that all of the permanent magnet, the solenoid coil and the separator are provided on the base member side of the holding device, such as shown in FIG. 6. In this example, the solenoid coil 3 is wound around the permanent magnet 4. Of course, the solenoid coil 3 may be wound around a portion of the yoke 2. Further modifications are possible, provided that the solenoid coil 3 can produce a magnetic flux which is effective to cancel the magnetic force of the permanent magnet.

Figure 7:
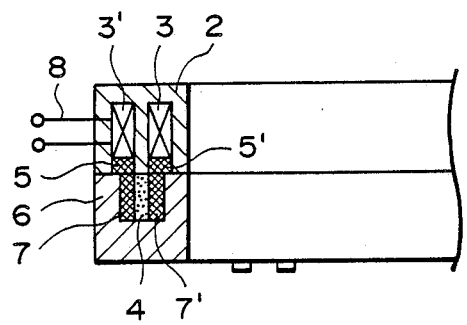
FIG. 7 is a fragmentary sectional view showing another modification of the FIG. 5 embodiment, in which modification, separate magnetic paths are formed.

FIG. 7 shows a modified form of a mask holding device. In this example, a pair of solenoid coils 3 and 3= and a pair of separators 5 and 5= are disposed in the yoke 2. On the other hand, a pair of separators 7 and 7= are disposed in the mask frame 6. Also, a single permanent magnet 4 is mounted on the mask frame 6 in such a manner that the magnet 4 is sandwiched between the separators 7 and 7=. As in the foregoing embodiments, each of the solenoid coils 3 and 3= is operative to produce a magnetic flux which is repulsive to that provided by the permanent magnet. With the arrangement of the present example, separate magnetic paths are defined, but substantially the same effects that are attainable with the foregoing embodiments are obtained.

Figure 8:
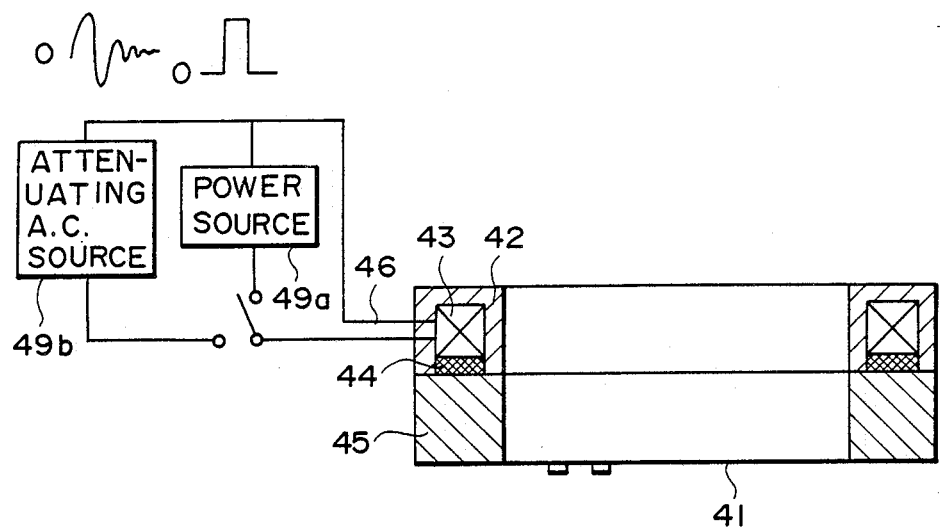
FIG. 8 is a sectional view schematically and diagrammatically showing a mask holding device according to another embodiment of the present invention.

Referring now to FIG. 8, description will be made to a mask holding device according to another embodiment of the present invention.

As shown in FIG. 8, a mask membrane 41 has a circuit pattern formed on its surface and has its outer peripheral portion fixed, by adhesion or the like, to a frame 45 of ring-like shape. A yoke 42 of similar ring-like shape is made of a magnetic material and is contributable to form a magnetic path. The yoke 42 accommodates therein, a solenoid coil 43 for producing magnetic lines of force, and a separator 44 which is made of a non-magnetic material and contributable to form a desired magnetic path or circuit. In this embodiment, the whole of each of the yoke 42 and the frame 45 or, alternatively, a portion of each of these elements to be contacted to the other when the frame 45 is attracted to the yoke 42, is made of such material that is effective to retain a higher intensity of remanence. As for such material, an iron steel material, represented by tool steel; an alloy of, for example, Fe and Al, Ni, and/or Co (called "alnico alloy") usable as a material of permanent magnets; a material, such as ferrite, containing iron oxide as its major component; or the like, can be used. Lead wires 46 are electrically connected to the solenoid coil 43 so as to energize the same with an electric power supplied from a power source 49a or an attenuating alternating voltage source 49b, both of which will be described later. In the mask holding device described above, the holding of the mask is effected in the following manner:

First, the mask frame 45 is put close to the yoke 42 or the mask frame 45 is contacted to the yoke 42, and the solenoid coil 43 is energized by an electric voltage of pulse-like form produced by the power source 49a and applied to the coil 43 by way of the lead wire 46. By this, the yoke 42 and the mask frame 45 are magnetized and they are attracted to each other. The time period for the energization of the solenoid coil 43 and thus for the magnetization of the yoke 2 and the mask frame 45 may be relatively short, for example on an order of 10-50 msec. Thus, the pulsed voltage is used. After completion of this momentary magnetization, the remanence is retained in the frame 45 and the yoke 42. This remanence forms a closed magnetic path (magnetic circuit) extending through the yoke 42 and the frame 45. By the magnetic force provided by the magnetic circuit, the frame 45 is still attracted to the yoke 42, magnetically.

In order to disengage the frame 45 from the yoke 42, an attenuating alternating voltage is applied to the solenoid coil 43 from the attenuating AC source 49b, such that the holding device is "demagnetized". By this, the remanence in the yoke 42 and the frame 45 is substantially deprived of, with the result that the frame 45 is disengaged from the yoke 42. The attenuating and alternating voltage for the sake of demagnetization is easily obtainable by, for example, using a posistor and by applying thereto, an AC voltage.

While in the foregoing embodiment the yoke and the solenoid coil are mounted on an unshown base member of the holding device, these elements may, of course, be mounted on the mask frame. In such a case, the base member of the holding device has a mask holder (holding plate) which is made of such a material that is effective to retain a higher intensity of remanence, like the yoke 42. Attraction and disengagement of the mask can be effected substantially in the same manner as described in the foregoing.

Figure 9:
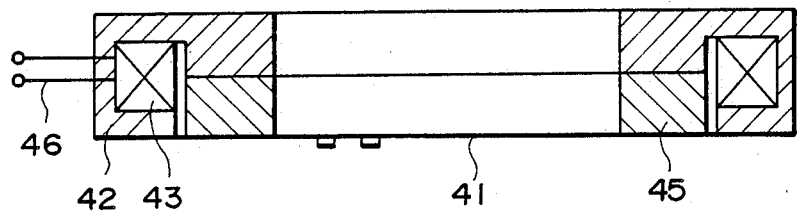
FIG. 9 is a sectional view showing a modification of the FIG. 8 embodiment, in which modification, the manner of providing a solenoid coil is changed.

Further, the manner of providing the solenoid coil 43 can be modified in various ways. FIG. 9 shows an example of such a modification. That is, in the FIG. 9 example, the solenoid coil is accommodated in an outer extension of the yoke 42, and the separator 44 of the FIG. 8 embodiment is omitted. In place thereof, a circumferentially extending gap is defined between an inner cylindrical surface of the solenoid coil 43 (and a portion of the yoke 42) and an outer peripheral surface of the mask frame 45, when it is attracted, such as shown in FIG. 9. The principle of attraction and disengagement of the mask frame 45 in this example is essentially the same as that of the FIG. 8 embodiment. The solenoid coil 43 may, of course, be wound directly on the yoke 42.

Figure 10:
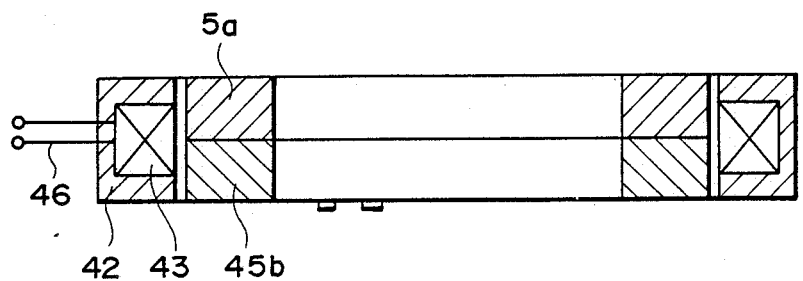
FIG. 10 is a sectional view showing another modification of the FIG. 8 embodiment, in which modification, a solenoid coil and a yoke are spaced from a mask holder a mask frame.

FIG. 10 shows another example of modification. In this example, an additional mask holder 45a of ring-like shape is provided, which is made of such material that is similar to the yoke 42 of the FIG. 8 embodiment. In the FIG. 10 example, as shown in the drawing, the magnetizing solenoid coil 43 and the yoke 42 are separated or isolated from the mask holder 45a and the mask frame 45b, when it is attracted, by means of a circumferentially extending gap or spacing. The size of such gap is selected so that it does not also reduce the magnetic force acting between the opposing surfaces of the mask holder 45a and the frame 45b. With the arrangement of the present example, the mask frame 45b can be completely thermally isolated from the magnetizing solenoid coil 43 and the yoke 42. Consequently, even if any heat is generated at the coil 43, such heat is not at all transferred to the mask.

In the embodiments described with reference to FIGS. 8-10, each of the mask frame and the yoke (or mask holder) is made of such material that easily retains the remanence. However, one of these elements may be formed by a mere magnetic material. For example, when a portion of a plate-like mask or a portion of a mask pattern is formed by a magnetic material, only the yoke may be formed of such material that easily retains the remanence, because the attraction and disengagement of the mask can be achieved by the magnetization and demagnetization of the yoke.

Referring now to FIGS. 11 and 12, description will be made to a mask holding device according to a further embodiment of the present invention. Of these Figures, FIG. 11 shows the device when it is in a state in which a mask is attracted thereto, while FIG. 12 shows the device when it is in a state in which the mask is disengaged therefrom.

In FIGS. 11 and 12, the device includes a yoke 52 which is contributable to form a desired magnetic path, and a solenoid coil 53 which extends circumferentially and is housed in the yoke 52. The solenoid coil 53 is provided in this embodiment to displace a permanent magnet 54 movably accommodated in a lower internal space defined in the yoke 52. The permanent magnet 54 has a ring-like shape and is movable in an up-and-down direction as viewed in FIGS. 11 and 12. Also, as shown in these drawings, the inner cylindrical surface 54a of the magnet 54 is spaced by a sufficient distance from an outer cylindrical surface 52a of the inner cylindrical leg portion of the yoke 52, for the sake of forming a desired magnetic path. Separators 55 and 56, each formed of a non-magnetic material, are disposed in order to direct the magnetic lines of force to thereby form a desired magnetic path. Lead wires 57 are electrically connected to the solenoid coil 53 so as to energize the same with an electric voltage from a voltage source 58. A mask 51 is, in this example, a plate-like member having a circuit pattern (not shown) formed on its lower surface. At least a portion of the mask 51 is made of a magnetic material in order to assure that the mask is attracted by the magnetic force. For example, an outer peripheral portion of the upper surface of the mask 51 is coated, by vacuum deposition or the like, with Ni.

When, in operation, the mask 51 is to be attracted, the solenoid coil 53 is energized by a DC voltage of pulse-like form produced from the DC power source 58 and applied thereto by way of the lead wires 57, while putting the mask 51 close to the lower end portion of the yoke 52 such as shown in FIG. 11. The permanent magnet 54 is so disposed that it is repulsively moved downwardly under the influence of a magnetic field produced by the solenoid coil 53 in response to application of a pulse of electric voltage (schematically depicted in FIG. 11) from the voltage source 58. Therefore, independently of the position of the permanent magnet 54 at the time of energization of the solenoid coil 53, the permanent magnet 54 is placed at the FIG. 11 position in response to the application of the pulse of electric voltage. As a result, a closed magnetic path (magnetic circuit) extending through the permanent magnet 54, yoke 52 and mask 51 is formed and, thereby, the mask 51 is continuously attracted under the influence of the magnetic field of the permanent magnet 54.

In order to disengage the mask 51 from the holding device, an electric voltage of pulse-like shape and having opposite polarity as the first-applied pulse voltage, such as schematically depicted in FIG. 12, is supplied from the voltage source 58 to the solenoid coil 53. By this, the solenoid coil 53 is so energized that it produces a magnetic field which is effective to draw or attract the permanent magnet 54 to the coil 53. As a result, the magnet 54 is moved upwardly, such that a closed magnetic path is formed within an upper portion of the yoke 52. Therefore, the magnetic flux does not reach the portion between the separators 55 and 56. Thus, the mask 51 is disengaged from the holding device.

Figure 13:
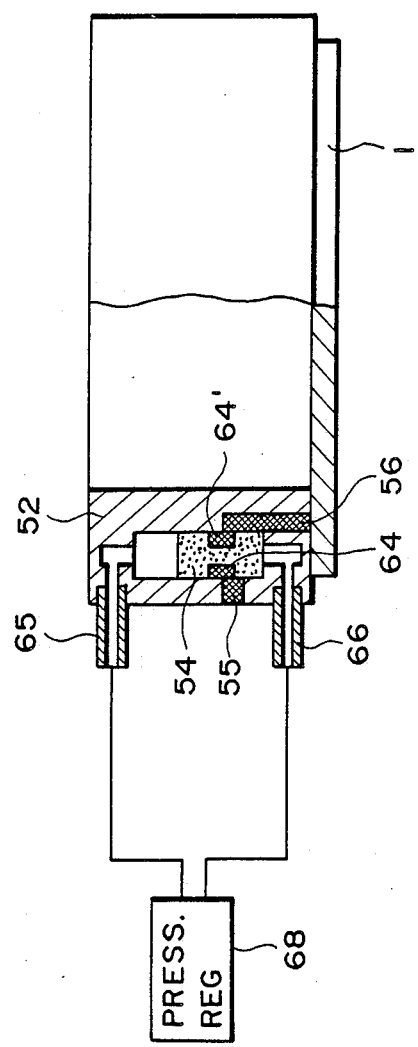
FIG. 13 is a sectional view schematically and diagrammatically showing a mask holding device according to a still further embodiment of the present invention.

FIG. 13 shows a modified form of mask holding device according to the present invention. Numerals the same as those used in the foregoing embodiments are assigned to elements having similar or corresponding functions. In FIG. 13, denoted by numeral 64 is a sealing member for preventing leakage of fluid pressure, and by numerals 65 and 66, are ports from which the fluid pressure is supplied into or exhausted from the opposite sides of a permanent magnet 54 which is, in this embodiment, movable in the up-and-down directions, like a piston. Denoted by numeral 68 is a pressure regulator which is adapted to supply, when the mask 1 is to be attracted, a fluid pressure into the port 65 and to allow exhaustion of a fluid pressure from the port 66. When the mask 1 is to be disengaged from the holding device, the regulator 68 operates in a reversed fashion.

When the fluid pressure is supplied into the port 65, the permanent magnet 54 is moved downwardly so that it is positioned as shown in FIG. 13. At this time, the magnetic lines of force of the permanent magnet 54 function, by way of the yoke 52, to attract the mask 1 to the yoke 52, such as described with reference to the foregoing embodiment. In order to disengage the mask 1 from the holding device, the fluid pressure is supplied into the port 66. By this, the permanent magnet 54 is moved upwardly and, thereby, a closed magnetic path is formed within an upper portion of the yoke 52. As a result, the magnetic attracting force to the mask is released and the mask is disengaged from the holding device.

Referring now to FIGS. 14–23, another aspect of the present invention will be described. Of these Figures, FIG. 14 shows a mask structure fabricated in accordance with one aspect of the present invention. In FIG. 15, denoted by numeral 71 is a mask membrane having a circuit pattern to be transferred onto a semiconductor wafer or the like, by 72, a base member for supporting the mask 71, and by 73, a mask frame provided to facilitate the handling of the mask. The mask base member 72 and the mask frame 73 are fixedly secured to each other by adhesion, or the like. As shown, the frame 73 has a circumferential groove formed in an outer peripheral surface thereof.

FIG. 15 shows a modified form of mask structure, in which the mask membrane 71 is directly adhered to the mask frame 73. FIG. 16 shows another modified form of mask structure, in which a protrudent portion extending circumferentially is formed on the outer peripheral surface of the mask frame 73. FIG. 18 shows a further modification of mask structure, in which a circumferential groove is formed in the peripheral surface of the frame 73a and a protruding member 73b is mounted in the groove. The protruding member 73b may be secured to the frame 73a by fastening, fitting or other means. It may be fixed by use of screws or, alternatively, by use of adhesion, or welding.

Further, the appearance or shape of the groove or protrusion, as viewed from above (i.e. in a plan view) may be circular, rectangular or the like. Other shapes may, or course, be utilized. When the groove or protrusion is circular or rectangular, such groove or protrusion is formed on the entire periphery of the frame. However, it is not always necessary to do so. That is, only a portion or portions of the periphery of the frame may be formed with such groove or protrusion. Also, the sectional shape of the groove may be semicircular, semielliptical, channel-like, and so on. FIG. 18 shows an example of a mask structure in which a circumferential groove is formed at an outer peripheral portion of the mask. FIG. 19 is a sectional view of the mask structure shown in FIG. 18. As illustrated, the groove of this example has a channel-like shape. FIGS. 20 and 21 show modified forms of mask structure, in which the groove is of V-shape (FIG. 20) and of a semicircular shape (FIG. 21).

When the mask structure is to be carried by a mask feeding device in which vacuum-suction and magnetic attraction cannot be utilized, the mask can still be held and conveyed positively and stably, using the above-described supporting portion defined by a groove or a protrusion. That is, if the supporting portion is provided by a groove, the mask can be pinched by, for example, abutting suitable members of the feeding device to the groove. If the supporting portion is provided by a protrusion, the mask also can be pinched by, for example, nipping or mesh-engaging the protrusion by, or with, a suitable member of the feeding device. What is important is that the shape of the mask structure, particularly the supporting portion thereof, is suited to the pinching components of the mask feeding device. This is also the case with the shape of the mask frame itself.

The mask structure according to the present invention can, of course, be held by vacuum suction when it is desired. Also, by forming at least a portion of the mask structure with a magnetic material, it can be held by magnetic attraction.

Figure 22:
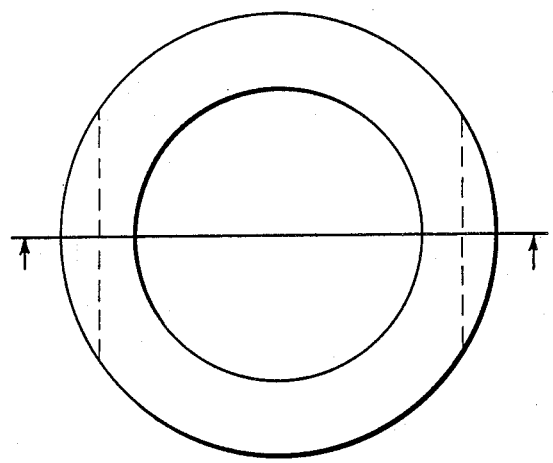
FIG. 22 is a plan view showing a mask structure according to another embodiment of the present invention, in which grooves are formed at portions of an outer peripheral surface of a frame.
Figure 23:
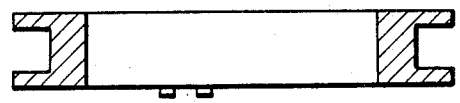
FIG. 23 is a sectional view showing the mask structure of the FIG. 22 embodiment.

Further, when the groove or protrusion providing the supporting portion is formed in a manner that indicates a particular direction, the orientation of the mask can be detected and adjusted easily. FIGS. 22 and 23 show an embodiment having a supporting portion arranged so. More particularly, two rectilinearly extending grooves are formed at diametrically opposed portions of the outer periphery of the mask structure. With this arrangement, the orientation of the mask itself can be detected on the basis of the orientation of the grooves formed in the frame. As a result, recognition of orientation of the mask is easily attainable. This allows quick and accurate adjustment of the orientation of the mask when it is to be conveyed to and set on a mask carrying station in a pattern transfer apparatus.

Further, the provision of a groove or protrusion on the mask frame assures that the mask can be held, when it is to be stored in a container, with its upper and lower surfaces being prevented from contacting the container.

Figure 24:
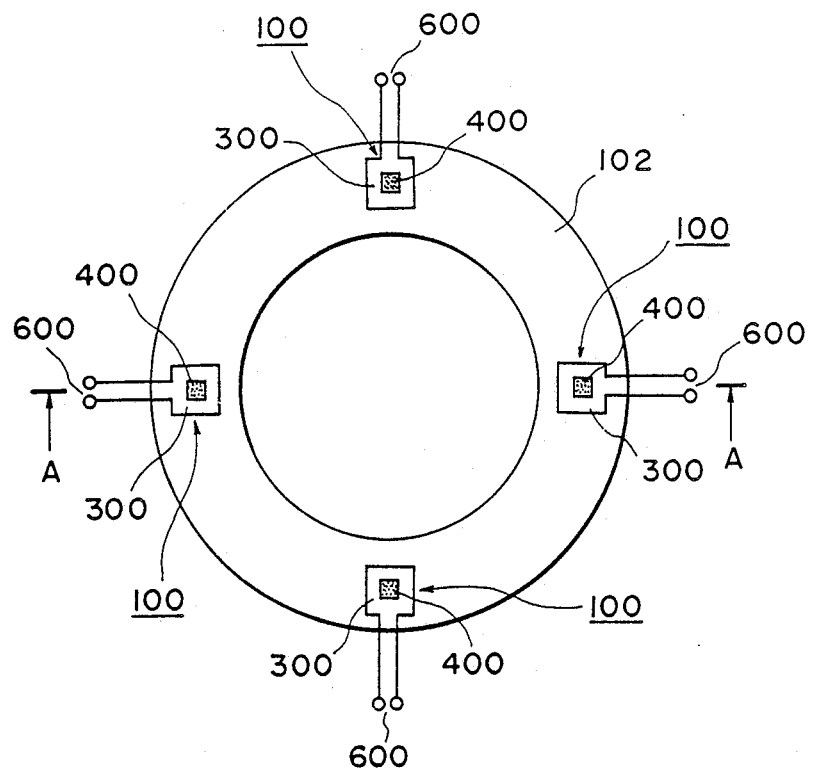
FIG. 24 is a schematic view of a mask chuck usable in a mask holding device according to another embodiment of the present invention.

Referring now to FIG. 24, there is schematically illustrated a mask chuck usable in a mask holding device according to another embodiment of the present invention. In this embodiment, the mask attracting or holding force is provided by permanent magnet means, as in the embodiment described with reference to FIG. 6. It should be noted, however, that while in the FIG. 6 embodiment, the permanent magnet 4 is provided by an integral member having a ring-like shape, the permanent magnet means used in the present embodiment is divided into plural and discrete magnets. Namely, as is best seen in FIG. 24, a plurality of permanent magnets 400 are disposed along the circumference of a chucking member 102. For each permanent magnet 400, one solenoid coil means 300 operable to substantially cancel the magnetic force of the magnet 400 is provided, to thereby constitute one attracting unit 100, as will be described later with reference to FIG. 25. These permanent magnets 400 and the coils 300 are generally provided in the lower surface of the chucking member 102.

Figure 25:
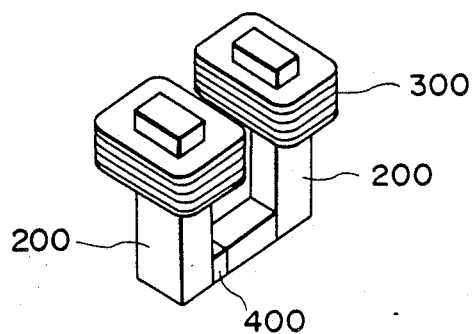
FIG. 25 is a fragmentary and enlarged view of a chucking force applying portion included in the FIG. 24 embodiment.

As is best seen in FIG. 25, each attracting unit 100 is provided by one permanent magnet 400, two yokes 200 and two coils 300 which are arranged as illustrated. For the disengagement of a mask having been held by the mask chuck, a magnetic force canceling electric current is applied to terminals 600 (FIG. 24) of the coils 300, as in the case of the FIG. 6 embodiment.

Figure 26:
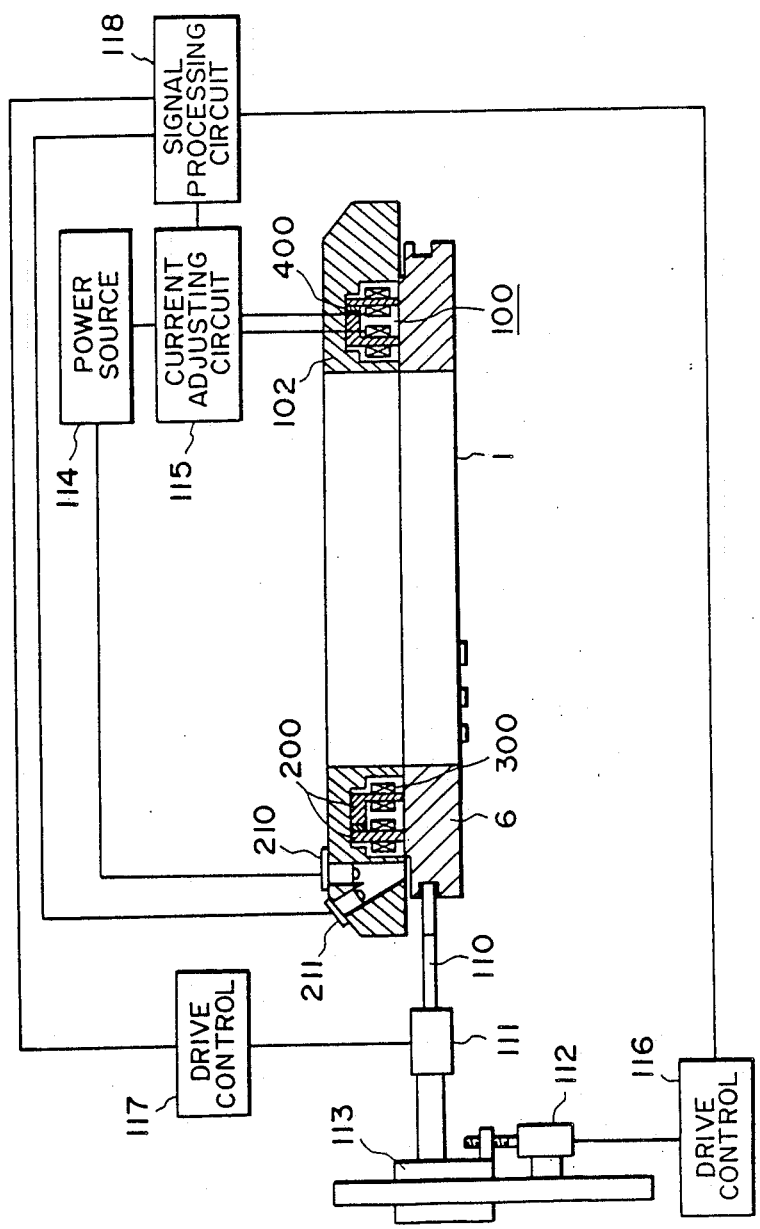
FIG. 26 is a schematic and diagrammatic view showing details of the structure of the mask holding device of the FIG. 24 embodiment.

FIG. 26 shows details of the mask holding device of the present embodiment which uses the mask chuck of FIG. 24. Denoted in FIG. 26 by numeral 110 is a movable hand which is operable to grip a mask 1, more particularly, a mask frame 6 of the mask 1. The hand 110 is movable horizontally as viewed in FIG. 26. More specifically, the hand 110 is movable rightwardly so as to grip the mask frame 6, and it is movable leftwardly so as to disengage the mask frame. Schematically illustrated at 111 is a driving mechanism for causing such horizontal movement of the hand 110. Further, the hand 110 is movable vertically with the aid of a driving mechanism 113 which includes a motor 112. The hand 110 is moved upwardly so as to bring the upper surface of the mask 1 close to the lower surface of the chuck 102, or to bring the former into contact with the latter. Also, the hand 110 is moved downwardly to move the mask away from or to disengage the mask from the chuck.

Light source 210 is provided on the mask chuck 102 to project light upon the upper surface of the mask frame 6. The light as reflected by the mask frame 6 is received by a photosensor 211 which is also disposed on the chuck 102. The photosensor 211 is adapted to produce an output corresponding to the quantity of the received light. The output signal from the photosensor 211 is supplied to a signal processing circuit 118 wherein the output signal from the photosensor 211 is compared with a reference light-quantity signal which would be obtainable from the photosensor when the upper surface of the mask 1 contacts the lower surface of the chuck 102. When, as a result of comparison, it is determined that the actual output signal from the photosensor has the same level as the reference signal, the signal processing circuit 118 produces a signal representing that the mask has contacted the chuck. In place of the photosensor of the type used in the present embodiment, a photosensor which can detect the current position of the mask on the basis of the position of incidence of the light reflected from the mask upon the sensor (such sensor is well known in the art) may, of course, be used. Further, an electrostatic capacitance type sensor may be used.

Power source 114 is provided to supply an electric current to the light source 210 and to the canceling coils 300 by way of a current adjusting circuit 115. The current adjusting circuit 115 is operable in response to the output signal from the signal processing circuit 118 so as to break or cut the electric current to the canceling coils 300. Drive controls 116 and 117 are provided to control the drive of the motor 112 and the drive of the driving mechanism 111, respectively. Referring now to the flow charts of FIGS. 27 and 28, description will be made of the operation of the FIG. 26 device.

First, in a state in which no mask is held by the chuck 102, the hand 110 is moved downwardly and is actuated to grip a mask placed on a suitable stage. Then, the hand 110 is moved upwardly by the driving motor 112 and the moving mechanism 113, toward the lower surface of the mask chuck 102. At this time, an electric current is supplied to the coils 300 by way of the current adjusting circuit 115 for the cancellation of the magnetic force of the magnets 400. Accordingly, the magnets 400 have substantially, or apparently, no attracting force for attracting the mask to the chuck 102.

During the upward movement of the mask 1, the photosensor 211 continuously detects the position of the mask 1. When the mask 1 contacts the chuck 102, the signal processing circuit 118 produces a "mask contact" signal, as described hereinbefore. Responsive to such a signal from the circuit 118, the magnetic force canceling electric current is broken, such that the mask frame 6 is attracted to the mask chuck 102. Simultaneously, the motor 112 is stopped. Thus, the mask 1 is fixedly held by the chuck 102. Thereafter, the hand 110 is moved leftwardly, as viewed in FIG. 26 so that the mask is released from the hand 110. By this, the chucking operation is completed.

While, in the above-described example, the magnetic force cancelling electric current is cut in response to the contact of the mask to the chuck, the current may, of course, be broken when the mask reaches a position which is spaced from the chuck by a minute gap or clearance. Further, in such a case, the cancelling current may be gradually attenuated by the current adjusting circuit 115 so as to completely prevent "shock" of the mask.

Since the mask is held by the permanent magnets after the mask contacts the chuck or after the mask reaches a position in close proximity to the chuck, no strong shock is applied to the mask. This is particularly preferable when the mask is formed by a thin film (membrane), as in the case of a mask used in an X-ray exposure apparatus. While such a mask is easily broken or damaged by shock, the unpreferable breakage or damage of the mask can be effectively prevented with the mask chucking operation of the present embodiment.

Figures 27, 28:
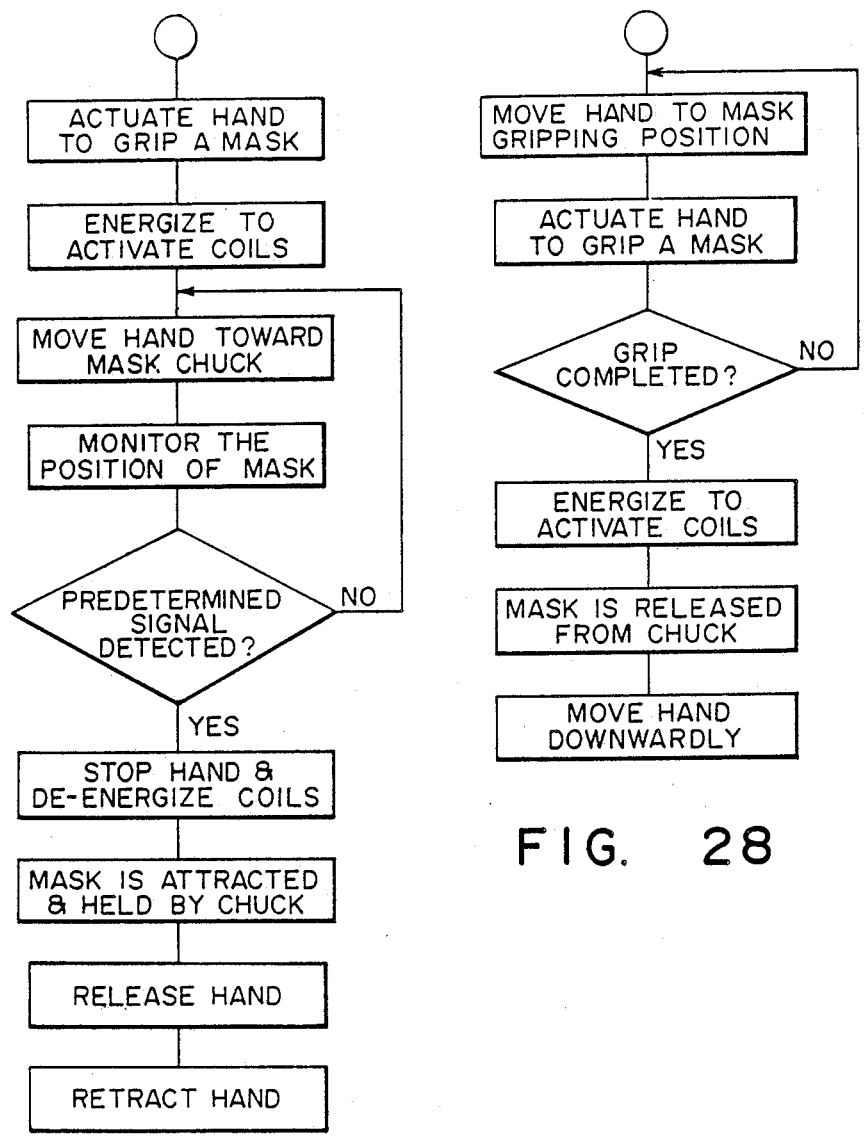
FIGS. 27 and 28 are flow charts showing the manner of the mask chucking and releasing operation in the mask holding device of FIG. 26.

The manner of disengagement of the mask, being held by the chuck, will be described in conjunction with the flow chart of FIG. 28. First, the moving mechanism 111 is actuated to move the hand 110 rightwardly, as viewed in FIG. 26. Whether the hand completes the gripping of the mask (mask frame) is detected by use of a suitable detector, not shown, and when it is completed, a grip completion signal is produced from the unshown detector. The grip completion signal is applied to the signal processing circuit 118. Responsive to the signal application, the circuit 118 produces a control signal which is supplied to the current adjusting circuit 115 to cause it to operate to apply an electric current to the coils 300. By this, all the attracting units 100 lose the mask attracting force. Thereafter, the moving mechanism 113 is actuated to move the hand 110 and therefore, the mask 1 downwardly.

The concept of the chucking and releasing of the mask as has been described with reference to FIGS. 24 to 28 may, of course, be applied to the mask holding device of the FIG. 6 embodiment. Further, it is also applicable to the embodiment as described with reference to FIGS. 11 and 12. In such a case, by controlling the application of an electric current to the coil 53, the magnet 54 may be moved downwardly in response to a "contact signal" supplied from a photosensor, and the magnet 54 may be moved upwardly after the mask is gripped by the hand. Moreover, the mask holding device of the FIG. 13 embodiment is usable in the manner of the present embodiment. Namely, by controlling the fluid application, the magnet 54 may be displaced in accordance with the position of the mask which is going to be chucked or which is being chucked.

Figure 29:
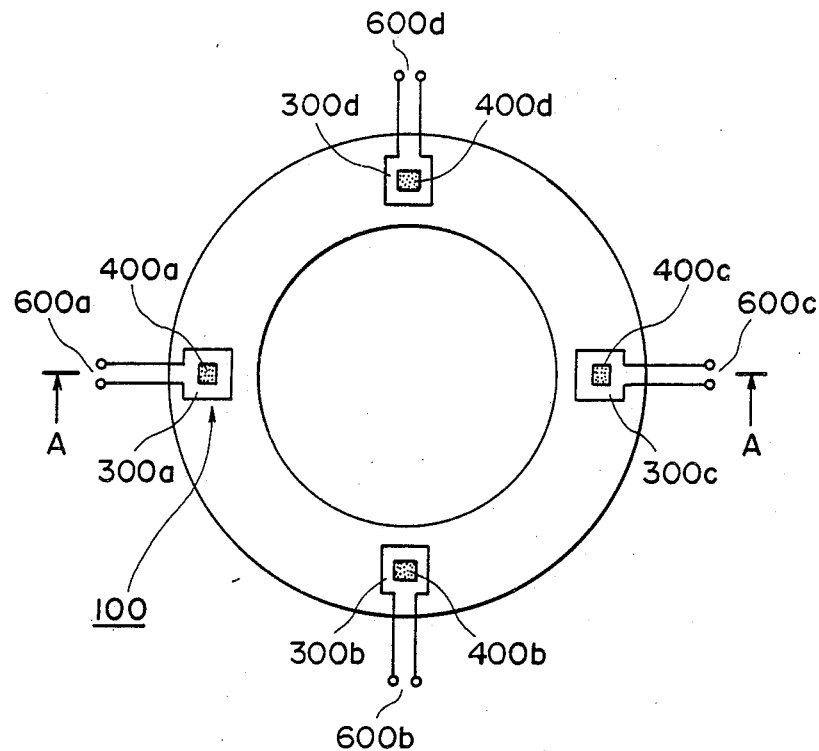
FIG. 29 is a schematic plan view of a mask holding device according to a further embodiment of the present invention.
Figure 30:
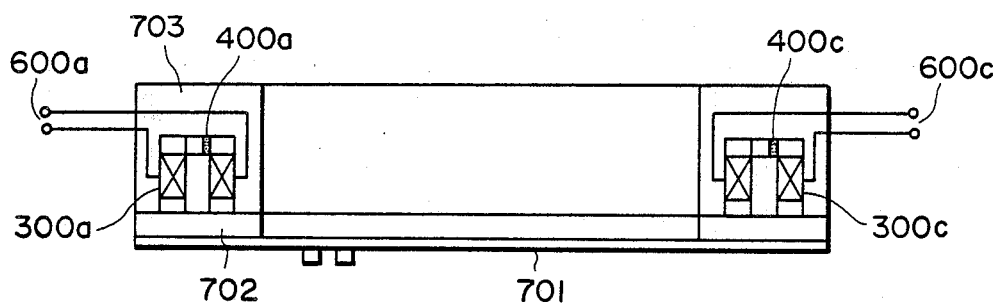
FIG. 30 is a schematic section of the mask holding device according to the FIG. 29 embodiment, taken on a line A—A in FIG. 29.

Referring now to FIGS. 29 and 30, there is shown a mask holding device according to a further embodiment of the present invention. In this embodiment, the present invention is applied to a mask holding device which is suitably usable as a mask chuck in an X-ray exposure apparatus.

Denoted at 701 in FIG. 30 is a mask membrane and denoted at 702 is a mask frame which is made of a magnetic material. A mask holder 703 has four permanent magnets 400a, 400b, 400c and 400d which are fixedly mounted to the mask holder 703, for attracting the mask frame 702 to the mask holder 703. Solenoid coils 300a, 300b, 300c and 300d are embedded in a circumferential portion of the mask holder 703. These solenoid coils are adapted to produce magnetic forces which are effective to variably control the attracting force to be applied to the mask frame 702. In this embodiment, the permanent magnets 400a–400d are used as cores of the solenoid coils 300a–300d, respectively. Lead wires 600a–600d function to supply electric currents to the solenoid coils 300a–300d, respectively.

In the present embodiment, the permanent magnets 400a–400d and the solenoid coils 600a–600d are used in four combinations to provide four magnetically attracting units, each being such as illustrated in FIG. 25. As best seen in FIG. 29, these four units are disposed in the mask holder 703 in an equiangular relation with respect to the circumferential direction of the mask holder. Namely, they are disposed in a right-angle relation. Further, in this embodiment, these magnetically attracting units are accommodated within a housing defined by the mask holder 703. This is made in consideration of the effect of heat generation by the solenoid coils to the outside of the mask holder. The four magnetically attracting units are operable to control or correct the flatness of the mask membrane, as will be described later. However, if it is desired to achieve the flatness control more precisely, a larger number of solenoid coils and permanent magnets (i.e. magnetically attracting units) may be provided. For example, eight units may be disposed circumferentially in a 45-degree relation. In any case, it is preferable that the magnetically attracting units are disposed symmetrically with respect to the center of the mask holder 703, as seen in FIG. 29.

Description will now be made of the manner of correcting the flatness of the mask membrane 701 by use of the mask holding device of the FIG. 29 embodiment. When, in operation, the mask frame 702 having a ring-like shape and being moved toward the mask holder 703 by a mask transporting hand (not shown) comes close to the mask holder 703, it is attracted to the mask holder 703 by the magnetic forces of the permanent magnets 400a–400d which are disposed circumferentially, as best seen in FIG. 29. After the attraction, the mask membrane 701 has a certain flatness (e.g. the surface irregularity, inclination) which is determined, as described hereinbefore, the flatness of the mask holding surface of the mask holding device, the flatness of the mask frame (a lip surface and/or a surface to be attracted to the mask holder) to which the mask membrane 701 is attached, the flexure of the mask due to gravity, etc. In the state as assumed at the time when the mask frame 702 is completely attracted to and held by the mask holder 703, the flatness of the mask membrane 701 is measured by use of an examining apparatus, such as a flatness measuring interferometer, which is well known in the art. Namely, the state of the membrane 701 surface with respect to a predetermined reference plane is observed by use of a suitable observation device, such as the flatness measuring interferometer. By this, any surface irregularity of the membrane 701 and any inclination of the membrane 701 surface with respect to a predetermined reference plane can be detected in the form of "surface information". Subsequently, in accordance with the thus obtained surface information concerning the irregularity and/or the inclination of the membrane 701, the magnetic force (magnetically attracting force) of one or more magnetically attracting units which correspond to such portion or portions of the mask membrane 701 that should be "corrected" is controlled. More specifically, controlled electric currents are supplied to appropriate solenoid coils of the magnetically attracting units to control the magnetic forces of the corresponding permanent magnets to thereby suitably change the magnetically attracting force of the mask holder 703. This is made to adjust the interval between such a portion of the mask membrane 701 (to which the correction should be made) and a plane including the holding surface of the mask holder 703, so that the surface of the mask membrane 701 is placed exactly in the reference plane or positioned within a range of tolerance set with respect to the reference plane. In summary, by suitably changing the distribution of magnetic forces, distributed circumferentially, of the magnetically attracting means of the mask holder 703, the flatness of the mask membrane is corrected, as a whole.

Figure 36:
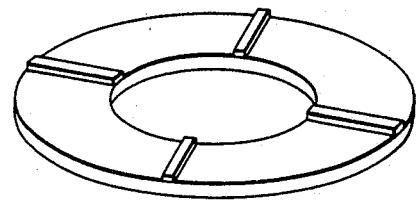
FIG. 36 is a fragmentary perspective view showing a modified form of a mask holding surface of the mask holding device of the FIG. 29 embodiment.

In order to enlarge the amount of flatness correction, the mask holder 703 may be provided with a plurality of surface protrusions, such as illustrated in FIG. 36. The provision of such protrusions is effective to allow a larger amount of deformation of the mask frame 702. Of course, such protrusions may be provided on the mask frame 702.

Figure 32:
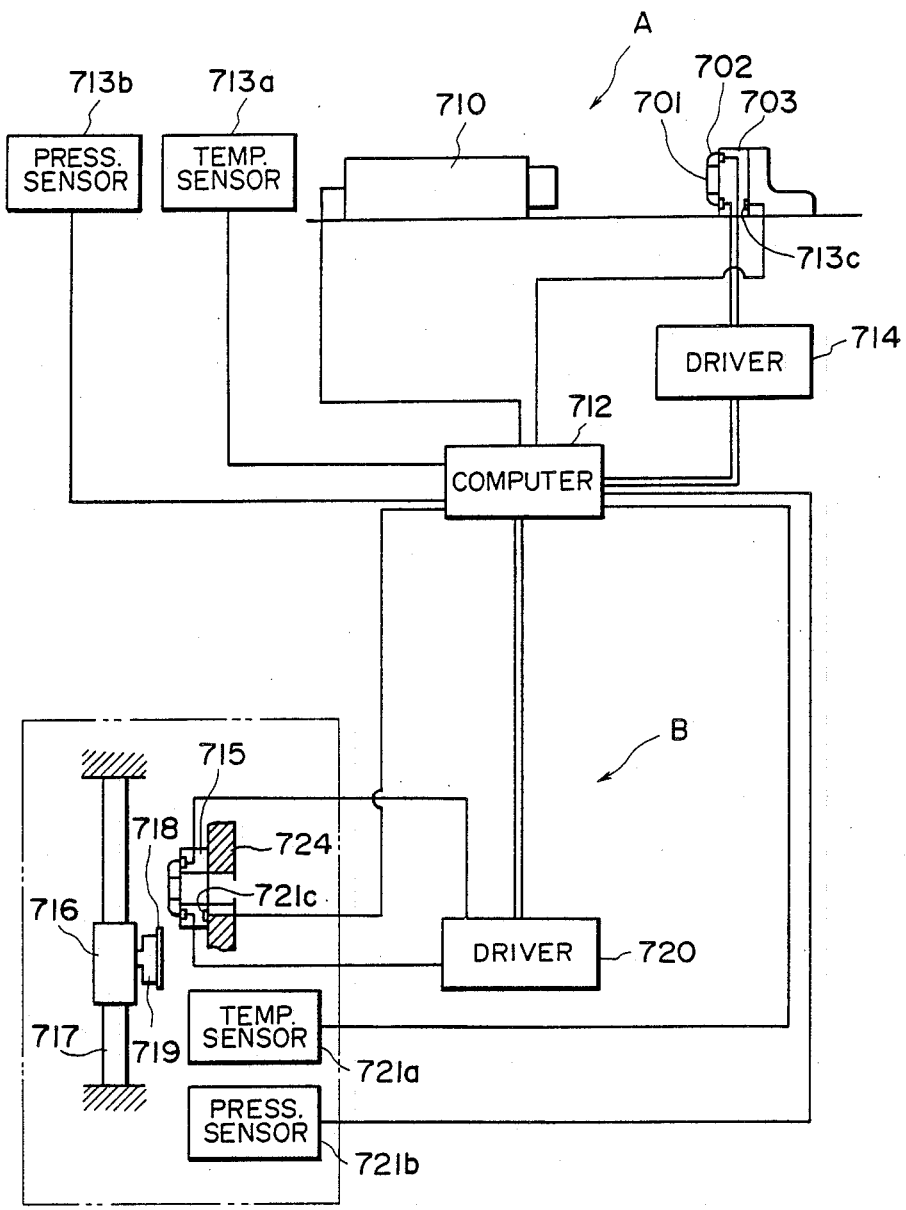
FIG. 32 is a schematic and diagrammatic view of an exposure system with a flatness correcting function, into which the mask holding device of the FIG. 29 embodiment is incorporated.

Referring now to FIG. 32, there is shown an exposure system arranged in accordance with another embodiment of the present invention. In this embodiment, as will be described later, two mask holding devices, each being such as described with reference to FIGS. 29 and 30, are incorporated.

The exposure system of the FIG. 32 embodiment includes a flatness measuring portion which is denoted generally at A and an exposure portion which is denoted generally at B. The measuring portion A includes a flatness measuring interferometer 710 which is supported by a surface plate. There are provided temperature sensors (one of which is diagrammatically illustrated at 713a) and a pressure sensor which is also diagrammatically illustrated at 713b. One (denoted at 713a) of the temperature sensors is provided to sense any temperature variation in an ambience surrounding the measuring station, while another temperature sensor 713c is provided to sense any temperature variation in a mask holder 703. Driving means 714 drives a plurality of magnetically attracting units, independently of each other, which units are provided on the mask holder 703. The driving means 714 is controlled by a computer 712.

The exposure portion B includes a mask holder 715 which is separate from the mask holder 703 of the measuring portion A. The exposure portion B further includes a wafer stage 716 which is movable along a guide bar 717. A wafer 718 having a surface layer (resist layer) is placed on a wafer holder 719 which is supported by the wafer stage 716. Driving means 720 drives a plurality of magnetically attracting units, independently of each other, provided on the mask holder 715. The driving means 720 is controlled by the computer 712. There are provided temperature sensors (one of which is diagrammatically illustrated at 721a) and a pressure sensor which is also diagrammatically illustrated at 721b. One (denoted at 721a) of the temperature sensors is provided to sense any temperature variation in an ambience surrounding the exposure station (more particularly, a mask held by the mask holder 715), while another temperature sensor 721c is provided to sense any temperature variation in the mask holder 715 itself. Denoted at 724 in FIG. 32 is a stationary supporting frame on which the mask holder 715 is fixedly secured.

Figure 33:
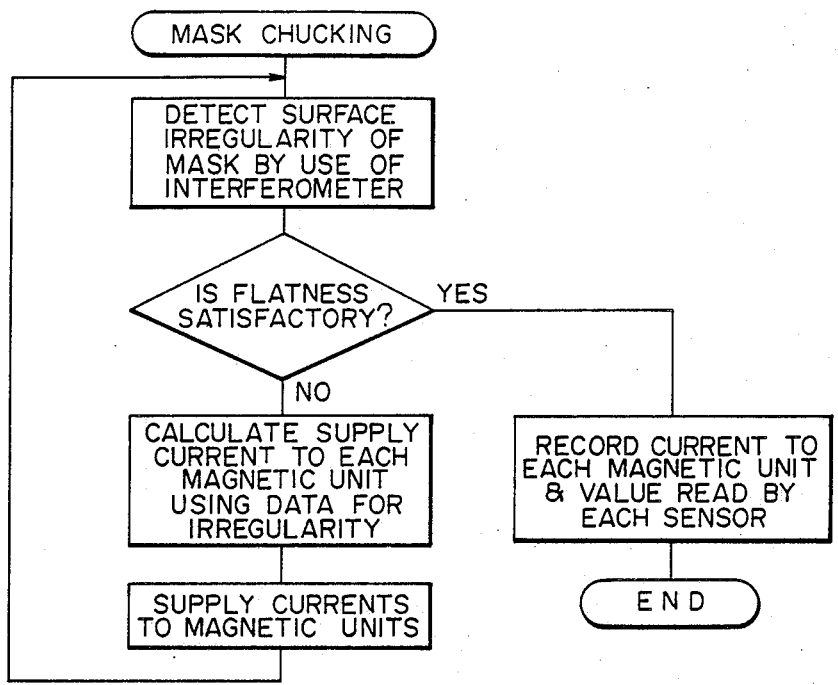
FIG. 33 is a flow chart showing the sequence for obtaining data necessary for the flatness correction, made in a flatness measuring portion included in the exposure system shown in FIG. 32.
Figure 34:
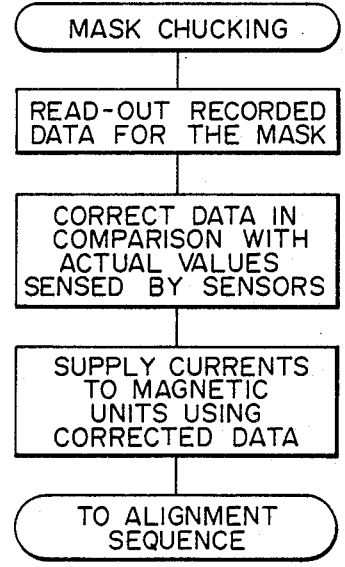
FIG. 34 is a flow chart showing the sequence of flatness correction made in an exposure portion included in the exposure system shown in FIG. 32.

Referring now to the flow charts of FIGS. 33 and 34, the operation of the exposure system of the FIG. 32 embodiment will be described.

In the exposure system of the FIG. 32 embodiment, each of the mask holder 703 included in the measuring portion A and the mask holder 715 included in the exposure portion B has the same structure as the mask holder described with reference to FIGS. 29 and 30. Namely, the mask holders 703 and 715 have the same configuration and their holding surfaces have been formed substantially with the same machining accuracy. Thus, the holding surfaces of these mask holders have substantially the same flatness. In other words, two mask holders having substantially the same mask holding characteristics are used in this embodiment. In the measuring portion A, a mask having a membrane 701 is attracted to and held by the mask holder 703. In the state in which the mask is held by the holder 703, the flatness measuring interferometer 710 is used to observe the state of the surface of the membrane 701, to measure the flatness of the membrane 701. The surface information concerning the state of the surface of the membrane 701, obtained by the interferometer 710, is supplied to the computer 712. The computer 712 operates, on the basis of the supplied surface information, to control the driving means 714 to cause it to supply controlled electric currents to appropriate one or ones of the solenoid coils of the magnetically attracting units (only two of which are illustrated in FIG. 32). As a result, the magnetically attracting force of the mask holder 703 provided by the permanent magnets included in the magnetically attracting units is controlled to adjust the interval between such portion of the mask membrane 701 to which the correction should be made and a plane containing the holding surface of the mask holder 703, so that the mask membrane 701, as a whole, is placed exactly in a predetermined reference plane or positioned within a range of tolerance set with respect to the reference plane.

As described hereinbefore, the driving means 714 supplies individually controlled electric currents to the magnetically attracting units, such that the magnetically attracting units are controlled independently of each other for the correction of the surface state of the mask membrane 701. At this time, in consideration of the resiliency of the mask frame 702 or otherwise, the computer 712 controls the driving means 714 so as to avoid that a large difference, greater than a predetermined difference is produced between the holding forces of the attracting units (i.e. the magnetically attracting forces of them). This is made to assure smooth correction. Further, in order to avoid accidental damage of the mask membrane 701, the computer 712 controls the driving means 714 so that gradually increasing electric currents are supplied to the magnetically attracting units.

After the correction, the measuring interferometer 710 is used again to observe the state of the mask membrane 701 and the flatness (surface irregularities, inclination and the like) of the mask membrane 701 is measured. If it is detected that the membrane 701 surface is in a satisfactory state as determined by the aforementioned tolerance, the values concerning the electric currents which are supplied at that time to the magnetically attracting units, as well as the values sensed at that time by the pressure sensor, and the temperature sensors are stored into a suitable memory included in the computer 712. If, on the other hand, the state of the membrane 701 surface is not yet satisfactory, the above-described surface correction is repeated.

After the re-measurement, the mask is detached from the mask holder 703 and is transported to the mask holder 715 of the exposure portion B. The mask is placed on the mask holder 715, and it is attracted to and held by the mask holder 715. A suitable sensing means is used to check whether or not the mask is held by the mask holder 715. When holding is determined, the computer 712 operates to correct the data concerning the electric currents and having been stored therein as a result of the measurement operation made in the measuring portion A. The data correction is made on the basis of any difference in the characteristics of corresponding magnetically-attracting units of the mask holder 703 and 715 (the information concerning such difference has been preparatorily stored in the computer 712) and the difference in the environmental conditions as sensed by the four temperature sensors and the two pressure sensors, in this embodiment. The computation for calculating the correction is made in accordance with a preset program. If it is desired to use different masks, the control data related to all the masks may be preparatorily stored, and in accordance with a selected mask, a corresponding portion of the data may be accessed.

After the data correction, the computer 712 supplies a control signal to the driving means 720, in response to which, the driving means 720 drives the magnetically attracting units of the mask holder 715, independently of each other. As a result, the desired surface state is reproduced within the exposure portion B. Although two mask holders 703 and 715 having substantially the same mask holding characteristics are used in the present embodiment, only one mask holder may be used if such a minute difference in the mask holding characteristics, which may be caused by a slight difference in the machining accuracy or otherwise, is considered undesirable. Namely, the mask holder 715 of the exposure portion B may be omitted and, in place thereof, the mask holder 703 of the measuring portion A may be modified so that it can be demounted from the measuring portion A and conveyed to the exposure portion B.

Figure 35:
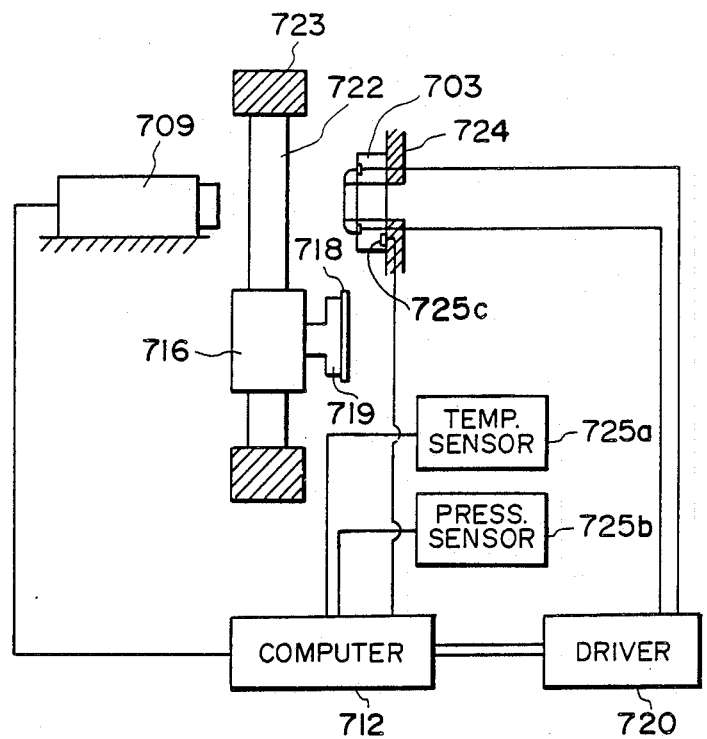
FIG. 35 is a schematic and diagrammatic view showing another exposure system with flatness correcting function, into which the mask holding device of the FIG. 29 embodiment is incorporated.

Referring now to FIG. 35, there is shown an exposure system with flatness correcting function, arranged in accordance with another embodiment of the present invention. The same reference numerals as the foregoing embodiment are assigned to corresponding or similar elements.

Wafer stage 716 is movable along a guide bar 722 which is fixedly supported by a frame 723. Mask holder 703 is fixedly secured to a holder frame 724. As in the foregoing embodiment, the exposure system of the FIG. 35 embodiment includes temperature sensors, one of which is diagrammatically illustrated at 725a, and a pressure sensor, which is diagrammatically illustrated at 725b. One (denoted at 725a) of the temperature sensors is provided to sense any temperature variation in an ambience surrounding the exposure station (pattern transfer station), while another temperature sensor 725c is provided to sense the temperature of the mask holder 703. One of the distinctive features of the present embodiment, over the FIG. 32, embodiment lies in that the measuring portion A and the exposure portion B of the FIG. 32 embodiment are combined as a unit so that, in the present embodiment, flatness measuring is attainable at the exposure station. The manner of measurement and correction of the surface state of the mask membrane is essentially the same as that made in FIG. 32 embodiment. It should be noted that, in this embodiment, only one and the same mask holder, such as at 703 is used at the exposure station, both for the measurement and the correction, such that there is no necessity of data correction in relation to the difference in the mask holding characteristic, as has been described with reference to the FIG. 32 embodiment.

Figure 31:
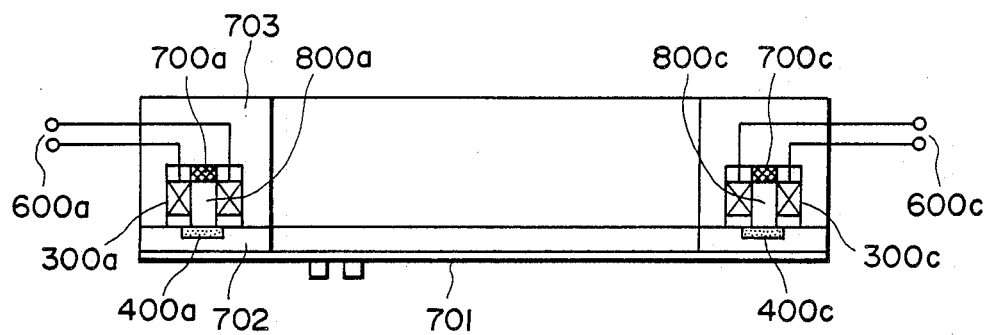
FIG. 31 is a schematic section showing a modified form of the mask holding device of the FIG. 29 embodiment.

In some embodiments described hereinbefore, the magnetically attracting units are provided on the mask holder side. However, the present invention is not limited to such structure. Namely, as illustrated in FIG. 31, permanent magnets (only two of which are shown at 400a and 400c) may be provided on a mask frame 702 while, on the other hand, solenoid coils (only two of which are shown at 300a and 300c) may be embedded in a peripheral portion of a mask holder 703. In this example, as illustrated, separators (only two of which are shown at 700a and 700c) and cores made of a magnetic material (only two of which are shown at 800a and 800c) are also provided on the mask holder 703 side. It will be readily understood that the mask holding device of this example is capable of variably controlling the attracting force of the permanent magnets, by supplying controlled electric currents to the solenoid coils. Additionally, in this example, it is possible to control the solenoid coil to cause it to produce a magnetic field opposing to or repelling the magnetic field of the permanent magnet. Such repelling force may be utilized to precisely adjust the clearance between the mask and the holding surface of the mask holder, for correction of the surface state of the mask membrane 701.

While the invention has been described with reference to the structures disclosed herein, it is not confined to the details set forth and this application is intended to cover such modifications or changes as may come within the purposes of the improvements or the scope of the following claims.

What is claimed is:

1. A mask holding device for use in an exposure apparatus, for detachable holding a mask, said device comprising:
    holding means comprising a mask holding surface for the mask to be held, said holding means further comprising attracting means for attracting the mask to said mask holding surface;
    driving means comprising means for moving the mask toward said mask holding surface;
    position detecting means for detecting the position of the mask and for producing a signal when the mask contacts or is in close proximity to said mask holding surface; and
    control means for controlling said attracting means for producing a mask attracting force in response to the signal produced by said position detecting means.

2. A device according to claim 1, wherein said driving means further comprises means for stopping movement of the mask in response to the signal produced by said position detecting means.

3. A device according to claim 1, wherein said attracting means comprises a combination of a permanent magnet for producing the mask attracting force and a canceling coil for substantially cancelling the attracting force of said permanent magnet.

4. A device according to claim 1, wherein said attracting means comprises an attracting member having a ring-like shape.

5. A device according to claim 1, wherein said attracting means comprises a plurality of attracting members.

6. A mask holding device for use in an exposure apparatus for exposing a wafer having a radiation sensitive layer to a pattern of a mask having a pattern, for holding the mask by use of magnetic force, said device comprising:
- a holder comprising a holding surface for detachably mounting the mask;
- a plurality of discrete permanent magnets provided in or on one of the holder and the mask for producing magnetic force for attracting the mask to the holder;
- a plurality of magnetic force adjusting means distributed along said holding surface of said holder for adjusting the magnetic force of said permanent magnets; and
- control means for controlling said magnetic force adjusting means independently of each other.

7. A mask holding device according to claim 6, wherein each of said magnetic force adjusting means comprises a solenoid coil.

8. A mask holding device according to claim 6, wherein each of said magnetic force adjusting means is disposed in a housing within the holder.

9. A mask holding device according to claim 6, wherein said magnetic force adjusting means are equiangularly disposed with respect to a center of said holding surface of said holder.

10. A mask holding device according to claim 6, wherein said holding surface of said holder comprises a plurality of protrusions.

11. An exposure apparatus including an exposure station for exposing a workpiece having a radiation sensitive layer to a pattern of a mask, said exposure apparatus comprising;
- first mask holding means comprising a first mask holding surface for detachably holding the mask by magnetic force at a predetermined station different from the exposure station, said first mask holding means comprising a plurality of independently operable magnetic force adjusting means being disposed separately from each other along said first mask holding surface of said first mask holding means;
- second mask holding means comprising a second mask holding surface for detachably holding the mask by magnetic force at the exposure station, said second mask holding means comprising a plurality of independently operable magnetic force adjusting means being disposed separately from each other along said second mask holding surface of said second mask holding means;
- observing means for observing flatness of the mask held by said first mask holding means at said predetermined station, said observing means comprising means for producing an output for operating said magnetic force adjusting means of said first mask holding means;
- memorizing means for memorizing data regarding the operation of said magnetic force adjusting means of said first mask holding means when a predetermined flatness of the mask is observed by said observing means; and
- detecting means for detecting an ambient condition of each of said first and second mask holding means;
- wherein said magnetic force adjusting means of said second mask holding means comprise means for operating in accordance with the data memorized by said memorizing means and the ambient conditions detected by said detecting means.

12. An apparatus according to claim 11, wherein each of said magnetic force adjusting means of said first and second mask holding means comprises a solenoid coil.

13. An apparatus according to claim 11, wherein said detecting means comprises means for detecting at least one of temperature and pressure as the ambient condition.

14. An exposure apparatus for exposing a wafer having a radiation sensitive material to a pattern of a mask, said exposure apparatus comprising:
- a mask holding device comprising a holding surface for holding the mask by magnetic force;
- a plurality of discrete permanent magnets disposed in or on one of the mask and the holder for producing magnetic force for attracting the mask to the holder;
- a plurality of magnetic force adjusting means for adjusting the magnetic force of said permanent magnets, said magnetic force adjusting means being disposed separately from each other along the holding surface of said holder;
- observing means for observing flatness of the mask held by the holder; and
- control means for controlling said magnetic force adjusting means independently of each other in accordance with flatness of the mask observed by said observing means.

15. An apparatus according to claim 14, wherein each of said magnetic force adjusting means comprises a solenoid coil.

* * * * *

UNITED STATES PATENT AND TRADEMARK OFFICE
CERTIFICATE OF CORRECTION

PATENT NO. : 4,963,921

DATED : October 16, 1990

INVENTOR(S) : Takao Kariya et al.

It is certified that error appears in the above-identified patent and that said Letters Patent is hereby corrected as shown below:

ON THE COVER PAGE

FOREIGN PATENT DOCUMENTS

"61-204442 12/1986 Japan ." should read --61-294442 12/1986 Japan .--.

COLUMN 1

Line 13, "devices such," should read --devices, such--.

COLUMN 2

Line 34, "has" should read --have--; and
Line 54, "has" should read --have--.

COLUMN 3

Line 26, "material. The" should read --material, the--, and "including:" should read --including--.

COLUMN 4

Line 43, "holder a" should read --holder and a--.

UNITED STATES PATENT AND TRADEMARK OFFICE
CERTIFICATE OF CORRECTION

PATENT NO. : 4,963,921

DATED : October 16, 1990

INVENTOR(S) : Takao Kariya et al.

It is certified that error appears in the above-identified patent and that said Letters Patent is hereby corrected as shown below:

COLUMN 6

Line 14, "separator" should read --separator 7--.

COLUMN 7

Line 7, "3⎯and" should read --3' and-- and "5⎯are" should read --5' are--;
    Line 8, "7⎯" should read --7'--;
    Line 12, "7⎯." should read --7'.--;
    Line 13, "3⎯is" should read --3' is--; and
    Line 57, "yoke 2" should read --yoke 42--.

COLUMN 8

Line 4, "deprived of," should read --relieved,--.

COLUMN 14

Line 15, "solenoid coils 600a-600d" should read --solenoid coils 300a-300d--.

COLUMN 16

Line 53, "difference" should read --difference,--.

UNITED STATES PATENT AND TRADEMARK OFFICE
CERTIFICATE OF CORRECTION

PATENT NO. : 4,963,921

DATED : October 16, 1990

INVENTOR(S) : Takao Kariya et al.

It is certified that error appears in the above-identified patent and that said Letters Patent is hereby corrected as shown below:

COLUMN 17

Line 2, "sensor," should read --sensor-- and "sensors" should read --sensors,--; and
Line 67, "FIG. 32, embodiment" should read --FIG. 32 embodiment,--.

COLUMN 18

Line 11, "characteristic," should read --characteristics,--; and
Line 45, "detachable" should read --detachably--.

COLUMN 19

Line 1, "substantially cancelling" should read --substantially canceling--; and
Line 42, "comprising;" should read --comprising:--.

Signed and Sealed this

Twenty-eighth Day of April, 1992

*Attest:*

HARRY F. MANBECK, JR.

*Attesting Officer*          *Commissioner of Patents and Trademarks*